US009652049B2

(12) United States Patent
Song et al.

(10) Patent No.: US 9,652,049 B2
(45) Date of Patent: May 16, 2017

(54) ELECTRICAL CONNECTOR HAVING AN EXTERNAL SWITCH

(71) Applicant: Samsung Electronics Co., Ltd., Gyeonggi-do (KR)

(72) Inventors: Kyunghoon Song, Gyeonggi-do (KR); Jungje Bang, Gyeongsangbuk-do (KR); Kicheol Bae, Seoul (KR); Kwangsub Lee, Gyeonggi-do (KR); Seyoung Jang, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 131 days.

(21) Appl. No.: 14/640,313

(22) Filed: Mar. 6, 2015

(65) Prior Publication Data

US 2015/0268738 A1 Sep. 24, 2015

(30) Foreign Application Priority Data

Mar. 19, 2014 (KR) ........................ 10-2014-0032158

(51) Int. Cl.
*H01R 24/00* (2011.01)
*G06F 3/02* (2006.01)
*H01H 13/48* (2006.01)
*H01R 13/703* (2006.01)
*H05K 1/18* (2006.01)
*H01R 24/62* (2011.01)

(52) U.S. Cl.
CPC ........... *G06F 3/0202* (2013.01); *H01H 13/48* (2013.01); *H01R 13/703* (2013.01); *H05K 1/184* (2013.01); *H01H 2215/004* (2013.01); *H01H 2215/036* (2013.01); *H01H 2221/05* (2013.01); *H01R 24/62* (2013.01); *H05K 2201/09163* (2013.01); *H05K 2201/10053* (2013.01); *H05K 2201/10189* (2013.01); *H05K 2201/10446* (2013.01); *H05K 2201/10537* (2013.01)

(58) Field of Classification Search
CPC H01R 13/70; H01R 13/7035; H01R 13/7036; H05K 1/18; H05K 1/181; H05K 1/182; H05K 1/183; H05K 1/184
USPC ................. 200/51 R, 51.11, 51.16, 51 LM
See application file for complete search history.

(56) References Cited

U.S. PATENT DOCUMENTS

| 4,891,013 A | 1/1990 | Komaki |
| 6,454,589 B1 * | 9/2002 | Yeh ................ H01R 13/6275 |
| | | 200/51 R |
| 6,956,180 B1 | 10/2005 | Su et al. |
| 8,382,505 B2 * | 2/2013 | Park ...................... A45D 20/12 |
| | | 439/181 |

(Continued)

FOREIGN PATENT DOCUMENTS

| FR | 2 665 027 A1 | 7/1990 |
| JP | 2000-133387 A | 5/2000 |
| WO | 03/005286 A1 | 1/2003 |

*Primary Examiner* — Vanessa Girardi
(74) *Attorney, Agent, or Firm* — Cha & Reiter, LLC

(57) ABSTRACT

An input device may include: (a) a connector that recognizes a connection of an external device; (b) a switch located at an upper end portion of the connector and that connects an electrical signal when a physical input of a threshold pressure or more is pressed; (c) a substrate connected to a connection terminal of the switch and mounted at a surface in which the switch is not located; and/or (d) a key base that presses the switch.

12 Claims, 6 Drawing Sheets

(56) References Cited

U.S. PATENT DOCUMENTS

| | | |
|---|---|---|
| 2006/0091006 A1 | 5/2006 | Wang et al. |
| 2007/0188128 A1 | 8/2007 | Blom |
| 2013/0210251 A1 | 8/2013 | Little et al. |
| 2013/0237085 A1 | 9/2013 | Kim et al. |

* cited by examiner

ELECTRICAL CONNECTOR HAVING AN EXTERNAL SWITCH

CLAIM OF PRIORITY

This application claims the benefit under 35 U.S.C. §119 (a) of a Korean patent application filed on Mar. 19, 2014 in the Korean Intellectual Property Office and assigned Serial No. 10-2014-0032158, the entire disclosure of which is hereby incorporated by reference.

BACKGROUND

1. Technical Field of the Invention

The present disclosure generally relates to an input device for detecting an external input, and more particularly, to hardware devices included in an input device.

2. Description of the Related Art

Nowadays, an electronic device provides various functions such as a communication function, music reproduction function, and camera function. In order to control such functions, a user input is required. To detect such an input, an electronic device including various input devices is required. Therefore, a general electronic device includes at least one physical key. For example, a power key, a home key, and a volume key as a hardware key may be mounted at the outside of the electronic device. When the user physically inputs a home key, the electronic device detects the user's home key input and performs a predetermined function.

Nowadays, users desire their portable electronic devices to have a small and/or thin form. In order to satisfy such user demands, components mounted within such electronic devices have been developed to have a size and thickness having a small form.

While the size and a thickness of components included within an electronic device are being reduced, the functions performed by the electronic devices have been increasing. It is difficult to continuously reduce the thickness of the electronic device while adding functions.

Input devices that detect external signals require certain constituent elements to perform such a function. However, such constituent components tend to increase the size and thickness of the electronic device. Balancing functionality and thickness of the device may necessitate reducing some of the functionality to achieve the desired thickness.

SUMMARY

The present disclosure generally relates to an input device for detecting an external signal.

In accordance with an aspect of the present disclosure, an input device may include: (a) a connector that recognizes a connection of an external device; (b) a switch located at an upper end portion of the connector and that connects an electrical signal, when a physical input of a threshold pressure or more is pressed; (c) a substrate connected to a connection terminal of the switch and mounted at a surface in which the switch is not located; and/or (d) a key base that presses the switch.

In accordance with another aspect of the present disclosure, an input device may include: (a) a connector that recognizes a connection of an external device; (b) a switch located at an upper end portion of the connector and that connects an electrical signal, when a physical input of a threshold pressure or more is pressed; (c) a protection portion that covers the connector, except for a surface at which the switch is located; (d) a substrate connected to a connection terminal of the switch and mounted at a surface at which the switch is not located; and/or (e) a key base that presses the switch.

In accordance with yet another aspect of the present disclosure, an electronic device may include an input recognition module that has a hole that can insert an external device and that has a surface that covers the hole and in which a surface that covers the hole is extended in an insertion direction of the external device and in which a switch is formed at one side surface of the extended surface and in which the switch includes a convex surface.

These and other aspects of the present disclosure will be described in greater detail hereinbelow.

BRIEF DESCRIPTION OF THE DRAWINGS

The above features and advantages of the present disclosure will be more apparent from the following detailed description in conjunction with the accompanying drawings, in which.

DETAILED DESCRIPTION

Figure 1:
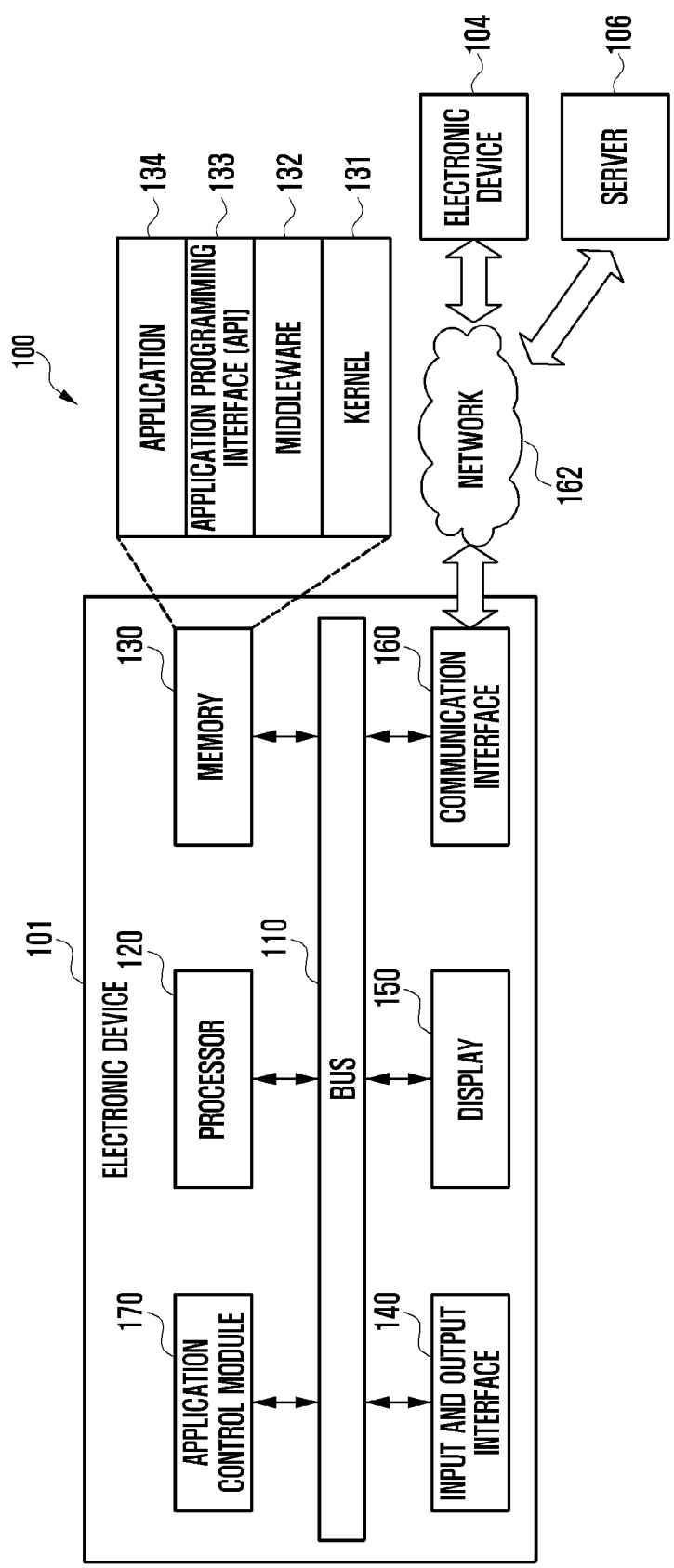
FIG. 1 is a block diagram illustrating a network environment including an electronic device according to an exemplary embodiment of the present disclosure.

Various exemplary embodiments of the present disclosure are described below with reference to the accompanying drawings. Various exemplary embodiments of the present disclosure are illustrated in the accompanying drawings and a related detailed description is stated. It should be understood that various modifications may be made to the exemplary embodiments without departing from the scope and spirit of the present disclosure. Accordingly, it should be understood that the various exemplary embodiments of the present disclosure are not intended to limit a specific embodiment form, and include all possible modifications or equivalents or substitutes within the spirit and technological scope of the present disclosure. In relation to a description of the drawing, like reference symbols denote like constituent elements.

The terms and words used in the following description and claims are not limited to the bibliographical meanings, but are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

As used herein, the singular forms "a", "an", and "the" are intended to include the plural forms, including "at least one", unless the content clearly indicates otherwise. "Or"

means "and/or". As used herein, the term "and/or" includes any and all combinations of one or more of the associated listed items. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first", "second", "third", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element", "component", "region", "layer" or "section" discussed below could be termed a second element, component, region, layer or section without departing from the teachings herein.

In this disclosure, an electronic device may be a device that has or involves a communication function. For example, an electronic device may be a smart phone, a tablet PC (Personal Computer), a mobile phone, a video phone, an e-book reader, a desktop PC, a laptop PC, a netbook computer, a PDA (Personal Digital Assistant), a PMP (Portable Multimedia Player), an MP3 player, a portable medical device, a digital camera, or a wearable device (e.g., an HMD (Head-Mounted Device) such as electronic glasses, electronic clothes, an electronic bracelet, an electronic necklace, an electronic appcessory (i.e., a physical device and counterpart application for a mobile device such as, for example a pedometer or a heart monitor), or a smart watch).

According to some embodiments, an electronic device may be a smart home appliance that has or involves a communication function. For example, an electronic device may be a TV, a DVD (Digital Video Disk) player, audio equipment, a refrigerator, an air conditioner, a vacuum cleaner, an oven, a microwave, a washing machine, an air cleaner, a set-top box, a TV box (e.g., Samsung HomeSync™, Apple TV™, Google TV™, etc.), a game console, an electronic dictionary, an electronic key, a camcorder, or an electronic picture frame.

According to some embodiments, an electronic device may be a medical device (e.g., MRA (Magnetic Resonance Angiography), MRI (Magnetic Resonance Imaging), CT (Computed Tomography), ultrasonography, etc.), a navigation device, a GPS (Global Positioning System) receiver, an EDR (Event Data Recorder), an FDR (Flight Data Recorder), a car infotainment device, electronic equipment for ship (e.g., a marine navigation system, a gyrocompass, etc.), avionics, security equipment, or an industrial or home robot.

According to some embodiments, an electronic device may be furniture or part of a building or construction having a communication function, an electronic board, an electronic signature receiving device, a projector, or various measuring instruments (e.g., a water meter, an electric meter, a gas meter, a wave meter, etc.). An electronic device disclosed herein may be one of the above-mentioned devices or any combination thereof. As well understood by those skilled in the art, the above-mentioned electronic devices are exemplary only and not to be considered as a limitation of this disclosure.

FIG. 1 is a block diagram illustrating a network environment 100 including therein an electronic device 101 in accordance with an embodiment of the present disclosure. Referring to FIG. 1, the electronic device 101 may include, but is not limited to, a bus 110, a processor 120, a memory 130, an input/output interface 140, a display 150, a communication interface 160, and an application control module 170.

The bus 110 may be a circuit designed for connecting the above-discussed elements and communicating data (e.g., a control message) between such elements.

The processor 120 may receive commands from the other elements (e.g., the memory 130, the input/output interface 140, the display 150, the communication interface 160, or the application control module 170, etc.) through the bus 110, interpret the received commands, and perform the arithmetic or data processing based on the interpreted commands.

The memory 130 may store therein commands or data received from or created at the processor 120 or other elements (e.g., the input/output interface 140, the display 150, the communication interface 160, or the application control module 170, etc.). The memory 130 may include programming modules such as a kernel 131, a middleware 132, an application programming interface (API) 133, and an application 134. Each of the programming modules may be composed of software, firmware, hardware, and any combination thereof.

The kernel 131 may control or manage system resources (e.g., the bus 110, the processor 120, or the memory 130, etc.) used for performing operations or functions of the other programming modules, e.g., the middleware 132, the API 133, or the application 134. Additionally, the kernel 131 may offer an interface that allows the middleware 132, the API 133 or the application 134 to access, control or manage individual elements of the electronic device 101.

The middleware 132 may perform intermediation by which the API 133 or the application 134 communicates with the kernel 131 to transmit or receive data. Additionally, in connection with task requests received from the applications 134, the middleware 132 may perform a control (e.g., scheduling or load balancing) for the task request by using technique such as assigning the priority for using a system resource of the electronic device 101 (e.g., the bus 110, the processor 120, or the memory 130, etc.) to at least one of the applications 134.

The API 133 which is an interface for allowing the application 134 to control a function provided by the kernel 131 or the middleware 132 may include, for example, at least one interface or function (e.g., a command) for a file control, a window control, an image processing, a text control, and the like.

According to an embodiment, the application 134 may include an SMS/MMS application, an email application, a calendar application, an alarm application, a health care application (e.g., an application for measuring quantity of motion or blood sugar), an environment information application (e.g., an application for offering information about atmospheric pressure, humidity, or temperature, etc.), and the like. Additionally or alternatively, the application 134 may be an application associated with an exchange of information between the electronic device 101 and any external electronic device (e.g., an external electronic device 104), and may include a notification relay application for delivering specific information to an external electronic device, or a device management application for managing an external electronic device.

For example, the notification relay application may include a function to deliver notification information created at any other application of the electronic device 101 (e.g., the SMS/MMS application, the email application, the health care application, or the environment information application, etc.) to an external electronic device (e.g., the electronic device 104). Additionally or alternatively, the notification relay application may receive notification information from an external electronic device (e.g., the electronic device 104) and offer it to a user. The device management application may manage (e.g., install, remove or update) a certain function (a turn-on/turn-off of an external electronic device (or some components thereof), or an adjustment of brightness (or resolution) of a display) of any external electronic device (e.g., the electronic device 104) communicating with the electronic device 101, a certain application operating at such an external electronic device, or a certain service (e.g., a call service or a message service) offered by such an external electronic device.

According to embodiments, the application 134 may include a specific application specified depending on attributes (e.g., a type) of an external electronic device (e.g., the electronic device 104). For example, in case an external electronic device is an MP3 player, the application 134 may include a specific application associated with a play of music. Similarly, in case an external electronic device is a portable medical device, the application 134 may include a specific application associated with health care. In an embodiment, the application 134 may include at least one of an application assigned to the electronic device 101 or an application received from an external electronic device (e.g., the server 106 or the electronic device 104).

The input/output interface 140 may deliver commands or data, entered by a user through an input/output unit (e.g., a sensor, a keyboard, or a touch screen), to the processor 120, the memory 130, the communication interface 160, or the application control module 170 via the bus 110. For example, the input/output interface 140 may offer data about a user's touch, entered through the touch screen, to the processor 120. Also, through the input/output unit (e.g., a speaker or a display), the input/output interface 140 may output commands or data, received from the processor 120, the memory 130, the communication interface 160, or the application control module 170 via the bus 110. For example, the input/output interface 140 may output voice data, processed through the processor 120, to a user through the speaker.

The display 150 may display thereon various kinds of information (e.g., multimedia data, text data, etc.) to a user.

The communication interface 160 may perform a communication between the electronic device 101 and any external electronic device (e.g., the electronic device 104 of the server 106). For example, the communication interface 160 may communicate with any external device by being connected with a network 162 through a wired or wireless communication. A wireless communication may include, but not limited to, at least one of WiFi (Wireless Fidelity), BT (Bluetooth), NFC (Near Field Communication), GPS (Global Positioning System), or a cellular communication (e.g., LTE, LTE-A, CDMA, WCDMA, UMTS, WiBro, or GSM, etc.). A wired communication may include, but not limited to, at least one of USB (Universal Serial Bus), HDMI (High Definition Multimedia Interface), RS-232 (Recommended Standard 232), or POTS (Plain Old Telephone Service).

According to an embodiment, the network 162 may be a communication network, which may include at least one of a computer network, an internet, an intranet, or a telephone network. According to an embodiment, a protocol (e.g., transport layer protocol, data link layer protocol, or physical layer protocol) for a communication between the electronic device 101 and any external device may be supported by at least one of the application 134, the API 133, the middleware 132, the kernel 131, or the communication interface 160.

The application control module 170 may process at least part of information obtained from the other elements (e.g., the processor 120, the memory 130, the input/output interface 140, or the communication interface 160, etc.) and then offer it to a user in various ways. For example, the application control module 170 may recognize information about access components equipped in the electronic device 101, store such information in the memory 130, and execute the application 134 on the basis of such information. A further description about the application control module 170 will be given hereinafter referring to FIGS. 2 to 6.

Figure 2:
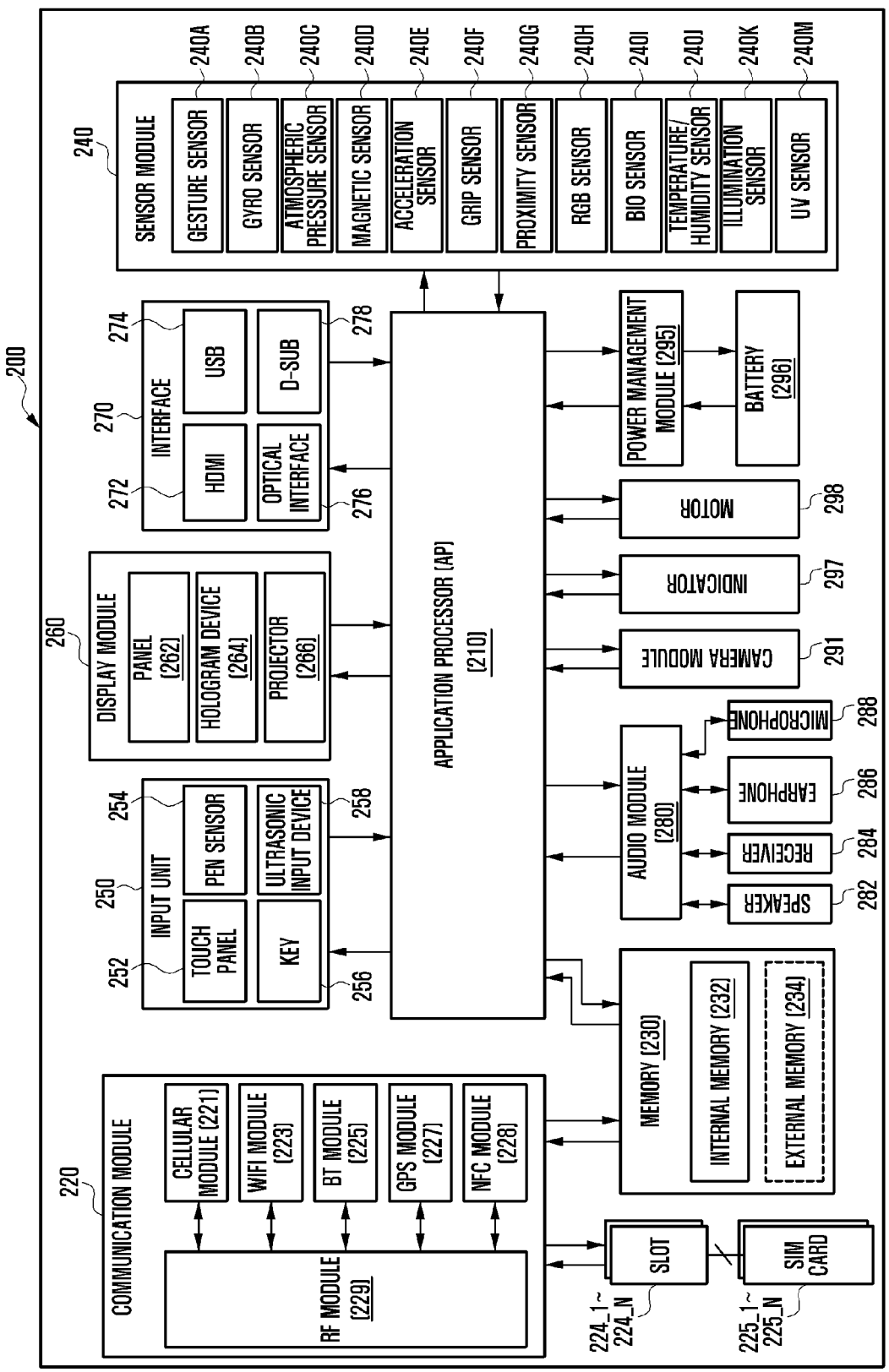
FIG. 2 is a block diagram illustrating a configuration of an electronic device according to an exemplary embodiment of the present disclosure.

FIG. 2 is a block diagram illustrating an electronic device 201 in accordance with an embodiment of the present disclosure. The electronic device 201 may form, for example, the whole or part of the electronic device 101 shown in FIG. 1. Referring to FIG. 2, the electronic device 201 may include at least one application processor (AP) 210, a communication module 220, a subscriber identification module (SIM) card 224, a memory 230, a sensor module 240, an input unit 250, a display 260, an interface 270, an audio module 280, a camera module 291, a power management module 295, a battery 296, an indicator 297, and a motor 298.

The AP 210 may drive an operating system or applications, control a plurality of hardware or software components connected thereto, and also perform processing and operation for various data including multimedia data. The AP 210 may be formed of system-on-chip (SoC), for example. According to an embodiment, the AP 210 may further include a graphic processing unit (GPU) (not shown).

The communication module 220 (e.g., the communication interface 160) may perform a data communication with any other electronic device (e.g., the electronic device 104 or the server 106) connected to the electronic device 200 (e.g., the electronic device 101) through the network. According to an embodiment, the communication module 220 may include therein a cellular module 221, a WiFi module 223, a BT module 225, a GPS module 227, an NFC module 228, and an RF (Radio Frequency) module 229.

The cellular module 221 may offer a voice call, a video call, a message service, an internet service, or the like through a communication network (e.g., LTE, LTE-A, CDMA, WCDMA, UMTS, WiBro, or GSM, etc.). Additionally, the cellular module 221 may perform identification and authentication of the electronic device in the communication network using the SIM card 224. According to an embodiment, the cellular module 221 may perform at least part of functions the AP 210 can provide. For example, the cellular module 221 may perform at least part of a multimedia control function.

According to an embodiment, the cellular module 221 may include a communication processor (CP). Additionally, the cellular module 221 may be formed of SoC, for example. Although some elements such as the cellular module 221 (e.g., the CP), the memory 230, or the power management module 295 are shown as separate elements being different from the AP 210 in FIG. 2, the AP 210 may be formed to have at least part (e.g., the cellular module 221) of the above elements in an embodiment.

According to an embodiment, the AP 210 or the cellular module 221 (e.g., the CP) may load commands or data, received from a nonvolatile memory connected thereto or from at least one of the other elements, into a volatile memory to process them. Additionally, the AP 210 or the cellular module 221 may store data, received from or created at one or more of the other elements, in the nonvolatile memory.

Each of the WiFi module 223, the BT module 225, the GPS module 227 and the NFC module 228 may include a processor for processing data transmitted or received therethrough. Although FIG. 2 shows the cellular module 221, the WiFi module 223, the BT module 225, the GPS module 227 and the NFC module 228 as different blocks, at least part of them may be contained in a single IC (Integrated Circuit) chip or a single IC package in an embodiment. For example, at least part (e.g., the CP corresponding to the cellular module 221 and a WiFi processor corresponding to the WiFi module 223) of respective processors corresponding to the cellular module 221, the WiFi module 223, the BT module 225, the GPS module 227 and the NFC module 228 may be formed as a single SoC.

The RF module 229 may transmit and receive data, e.g., RF signals or any other electric signals. Although not shown, the RF module 229 may include a transceiver, a PAM (Power Amp Module), a frequency filter, an LNA (Low Noise Amplifier), or the like. Also, the RF module 229 may include any component, e.g., a wire or a conductor, for transmission of electromagnetic waves in a free air space. Although FIG. 2 shows that the cellular module 221, the WiFi module 223, the BT module 225, the GPS module 227 and the NFC module 228 share the RF module 229, at least one of them may perform transmission and reception of RF signals through a separate RF module in an embodiment.

The SIM card 224_1 to 224_N may be a specific card formed of SIM and may be inserted into a slot 225_1 to 225_N formed at a certain place of the electronic device. The SIM card 224_1 to 224_N may contain therein an ICCID (Integrated Circuit Card IDentifier) or an IMSI (International Mobile Subscriber Identity).

The memory 230 (e.g., the memory 130) may include an internal memory 232 and an external memory 234. The internal memory 232 may include, for example, at least one of a volatile memory (e.g., DRAM (Dynamic RAM), SRAM (Static RAM), SDRAM (Synchronous DRAM), etc.) or a nonvolatile memory (e.g., OTPROM (One Time Programmable ROM), PROM (Programmable ROM), EPROM (Erasable and Programmable ROM), EEPROM (Electrically Erasable and Programmable ROM), mask ROM, flash ROM, NAND flash memory, NOR flash memory, etc.).

According to an embodiment, the internal memory 232 may have the form of an SSD (Solid State Drive). The external memory 234 may include a flash drive, e.g., CF (Compact Flash), SD (Secure Digital), Micro-SD (Micro Secure Digital), Mini-SD (Mini Secure Digital), xD (eXtreme Digital), memory stick, or the like. The external memory 234 may be functionally connected to the electronic device 200 through various interfaces. According to an embodiment, the electronic device 200 may further include a storage device or medium such as a hard drive.

The sensor module 240 may measure physical quantity or sense an operating status of the electronic device 200, and then convert measured or sensed information into electric signals. The sensor module 240 may include, for example, at least one of a gesture sensor 240A, a gyro sensor 240B, an atmospheric sensor 240C, a magnetic sensor 240D, an acceleration sensor 240E, a grip sensor 240F, a proximity sensor 240G, a color sensor 240H (e.g., RGB (Red, Green, Blue) sensor), a biometric sensor 240I, a temperature-humidity sensor 240J, an illumination sensor 240K, and a UV (ultraviolet) sensor 240M. Additionally or alternatively, the sensor module 240 may include, e.g., an E-nose sensor (not shown), an EMG (electromyography) sensor (not shown), an EEG (electroencephalogram) sensor (not shown), an ECG (electrocardiogram) sensor (not shown), an IR (infrared) sensor (not shown), an iris scan sensor (not shown), or a finger scan sensor (not shown). Also, the sensor module 240 may include a control circuit for controlling one or more sensors equipped therein.

The input unit 250 may include a touch panel 252, a digital pen sensor 254, a key 256, or an ultrasonic input unit 258. The touch panel 252 may recognize a touch input in a manner of capacitive type, resistive type, infrared type, or ultrasonic type. Also, the touch panel 252 may further include a control circuit. In case of a capacitive type, a physical contact or proximity may be recognized. The touch panel 252 may further include a tactile layer. In this case, the touch panel 252 may offer a tactile feedback to a user.

The digital pen sensor 254 may be formed in the same or similar manner as receiving a touch input or by using a separate recognition sheet. The key 256 may include, for example, a physical button, an optical key, or a keypad. The ultrasonic input unit 258 is a specific device capable of identifying data by sensing sound waves with a microphone 288 in the electronic device 200 through an input tool that generates ultrasonic signals, thus allowing wireless recognition. According to an embodiment, the electronic device 200 may receive a user input from any external device (e.g., a computer or a server) connected thereto through the communication module 220.

The display 260 (e.g., the display 150) may include a panel 262, a hologram 264, or a projector 266. The panel 262 may be, for example, a LCD (Liquid Crystal Display), an AM-OLED (Active Matrix Organic Light Emitting Diode), or the like. The panel 262 may have a flexible, transparent or wearable form. The panel 262 may be formed of a single module with the touch panel 252. The hologram 264 may show a stereoscopic image in the air using interference of light. The projector 266 may project an image onto a screen, which may be located at the inside or outside of the electronic device 200. According to an embodiment, the display 260 may further include a control circuit for controlling the panel 262, the hologram 264, and the projector 266.

The interface 270 may include, for example, an HDMI (High-Definition Multimedia Interface) 272, a USB (Universal Serial Bus) 274, an optical interface 276, or a D-sub (D-subminiature) 278. The interface 270 may be contained, for example, in the communication interface 160 shown in FIG. 1. Additionally or alternatively, the interface 270 may include, for example, an MHL (Mobile High-definition Link) interface, an SD (Secure Digital) card/MMC (Multi-Media Card) interface, or an IrDA (Infrared Data Association) interface.

The audio module 280 may perform a conversion between sounds and electric signals. At least part of the audio module 280 may be contained, for example, in the input/output interface 140 shown in FIG. 1. The audio module 280 may process sound information inputted or outputted through a speaker 282, a receiver 284, an earphone 286, or a microphone 288.

The camera module 291 is a device capable of obtaining still images and moving images. According to an embodiment, the camera module 291 may include at least one image sensor (e.g., a front sensor or a rear sensor), a lens (not shown), an ISP (Image Signal Processor, not shown), or a flash (e.g., LED or xenon lamp, not shown).

The power management module 295 may manage electric power of the electronic device 200. Although not shown, the power management module 295 may include, for example, a PMIC (Power Management Integrated Circuit), a charger IC, and/or a battery or fuel gauge.

The PMIC may be formed, for example, of an IC chip or SoC. Charging may be performed in a wired or wireless manner. The charger IC may charge a battery 296 and prevent overvoltage or overcurrent from a charger. According to an embodiment, the charger IC may have a charger IC used for at least one of wired and wireless charging types. A wireless charging type may include, for example, a magnetic resonance type, a magnetic induction type, or an electromagnetic type. Any additional circuit for a wireless charging may be further used such as a coil loop, a resonance circuit, or a rectifier.

The battery gauge may measure the residual amount of the battery 296 and a voltage, current or temperature in a charging process. The battery 296 may store or create electric power therein and supply electric power to the electronic device 200. The battery 296 may be, for example, a rechargeable battery or a solar battery.

The indicator 297 may show thereon a current status (e.g., a booting status, a message status, or a recharging status) of the electronic device 200 or of its part (e.g., the AP 210). The motor 298 may convert an electric signal into a mechanical vibration. Although not shown, the electronic device 200 may include a specific processor (e.g., GPU) for supporting a mobile TV. This processor may process media data that comply with standards of DMB (Digital Multimedia Broadcasting), DVB (Digital Video Broadcasting), or media flow.

Each of the above-discussed elements of the electronic device disclosed herein may be formed of one or more components, and its name may be varied according to the type of the electronic device. The electronic device disclosed herein may be formed of at least one of the above-discussed elements without some elements or with additional other elements. Some of the elements may be integrated into a single entity that still performs the same functions as those of such elements before integrated.

The term "module" used in this disclosure may refer to a certain unit that includes one of hardware, software and firmware or any combination thereof. The module may be interchangeably used with unit, logic, logical block, component, or circuit, for example. The module may be the minimum unit, or part thereof, which performs one or more particular functions. The module may be formed mechanically or electronically. For example, the module disclosed herein may include at least one of ASIC (Application-Specific Integrated Circuit) chip, FPGAs (Field-Programmable Gate Arrays), and programmable-logic device, which have been known or are to be developed.

Figure 3:
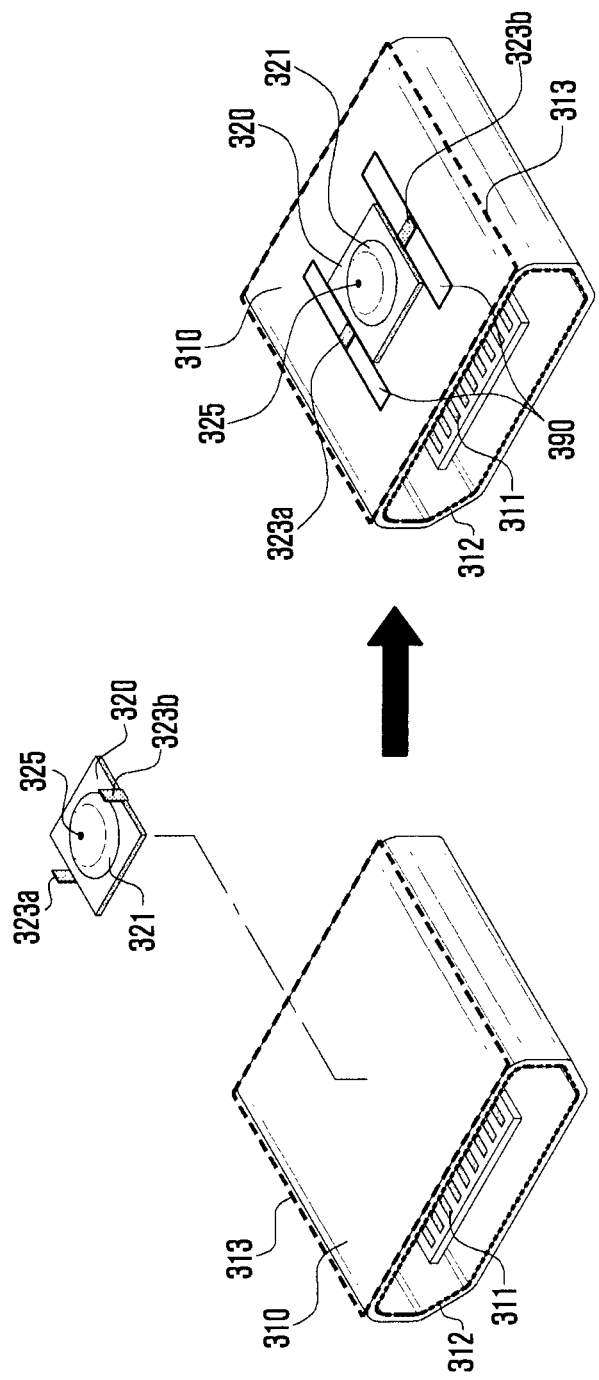
FIG. 3 is a diagram illustrating an integral form of a connector and a switch, which are elements of an input device according to an exemplary embodiment of the present disclosure.

FIG. 3 is a diagram illustrating an integral form of a connector 310 and a switch 320, which are elements of an input device 300 according to various exemplary embodiments of the present disclosure.

According to an exemplary embodiment of the present disclosure, it is assumed that the input device 300 is a home key of an electronic device. However, in exemplary embodiments of the present disclosure, the input device 300 is not limited to a home key and may include an external interface (e.g., an earphone interface, a power source interface, and a volume interface). The input device 300 may include a function in which the input unit 250 or the interface 270 (e.g., a keypad and a hardware key) performs.

According to an exemplary embodiment of the present disclosure, the input device 300 may include the connector 310 and the switch 320.

The connector 310 may recognize a connection to an external device. When the external device is mounted in the connector 310, a connection terminal 311 of the connector 310 may recognize this and transfer a connection state through a contact point 331c of a substrate 330. The substrate 330 may transfer information about the transferred connection state to the AP 210. For example, when a battery charge device, a Universal Serial Bus (USB) cable device, and an earphone device are mounted in the connector 310, the connection terminal 311 of the connector 310 may transfer information about a connection of the external device to the AP 210 through the substrate 330.

According to an exemplary embodiment of the present disclosure, the switch 320 may include a dome 321, connection terminals 323a and 323b of the switch, and a condensation protrusion 325.

According to an exemplary embodiment, when a physical input of a threshold pressure or more is pressed, the switch 320 may connect an electrical signal. Here, a physical input of a threshold pressure or more may be a minimum pressure that can connect an electrical signal. Here, a physical input may be an input by a force (e.g., a pressing force of a user, a force pressing using an external material) transferred from the outside. For example, when elasticity of the dome 321 of the switch 320 is changed according to a physical input (e.g., pressing of a user), the switch 320 may be electrically connected (e.g., short) to contact points 331a and 331b of the substrate 330. When a physical input to the switch 320 is released, the switch 320 is restored in an original form to release an electrical connection to the contact points 331a and 331b of the substrate 330.

Here, a connection of an electrical signal may be a connection of a signal that detects a user input, when a user applies a pressure (e.g., a hardware input event) to an input device (e.g., a home key). When the AP 210 receives a connection of an electrical signal through the substrate 330, the AP 210 may perform a function corresponding to a connection of the electrical signal. For example, when a physical input is detected through the switch 320, the AP 210 may display a predetermined function (e.g., an image, a text, and an earphone interface) in the display 150.

According to an exemplary embodiment, the switch 320 may be detached from the connector 310.

According to an exemplary embodiment, the switch 320 may be located in an upper end portion 313 of the connector 310. For example, the switch 320 may be disposed in the upper end portion 313 of the connector 310 using at least one method of a detachable tape 390, a molding method for fixing, and a coupling method of fastening and fixing the switch 320 at a predetermined location. The switch 320 may be disposed at the center or one side surface of the upper end portion 313 of the connector 310. According to an exemplary embodiment, a surface of the connector 310 may be a surface (e.g., a step-shaped surface, 30° inclined surface, 45° inclined surface) including a tilt and a curve of the connector 310 as well as a flat plane.

According to an exemplary embodiment, the switch 320 may be formed integrally with the connector 310. According to an exemplary embodiment, the electronic devices 100, 101, and 104 may include an input recognition module that has a surface that covers a hole 312 that can insert the external device and in which a surface extending a covering surface is formed in an insertion direction of the external device based on the surface that covers the hole 312 and in which the switch 320 is formed at a side surface of the extended surface to have a form of a convex surface. Here, the hole 312 may have a form of a circle, a rectangle, a trapezoid, a form having at least one curve, and a curved portion having symmetry (e.g., a lateral form, a vertical form, and southeast and northwest forms are the same).

According to an exemplary embodiment, the switch 320 may be formed on a plane of an extended surface. Here, a surface in which the switch 320 is formed may be an upper end portion (e.g., a widest surface among an area of the extended surface, a surface of a direction bent by 90° or 270° based on a direction in which the external device is mounted) of an extended surface. For example, a surface in which the switch 320 is formed may be a flat surface among extended surfaces.

According to an exemplary embodiment, the extended surface and the switch 320 are integrally formed, and only a form of the dome 321 may be a protruded form. According to an exemplary embodiment, an input recognition module may have the same form as that of the integrated switch 320 and connector 310.

According to an exemplary embodiment, the switch 320 may be located at the center or one side surface of the upper end portion 313 of the connector 310.

According to an exemplary embodiment of the present disclosure, the switch 320 may be formed in a form of a dome pattern switch or a dome sheet. The switch 320 may be a Dual In line Package (DIP) type in which a plurality of connection terminals 323a and 323b are protruded to a side surface, a Surface Mount Device (SMD), and a Single In line Package (SIP) type in which a single connection terminal 323a or 323b is mounted. By applying Surface Mount Technology (SMT), the switch 320 may be located at an upper end portion of the connector 310.

According to an exemplary embodiment of the present disclosure, the dome 321 of the switch 320 may be formed in a dome shape (e.g., a convex shape, a cylindrical shape, a hemispherical shape, and a cone shape). Because the dome 321 should repeatedly move upward and downward, the dome 321 may be preferably both durability and elasticity. According to an exemplary embodiment, the dome 321 may be a metal dome.

According to an exemplary embodiment of the present disclosure, a condensation protrusion 325 may be located at an upper end portion of the dome 321. When the user presses the condensation protrusion 325, the condensation protrusion 325 may condensate and transfer a pressure transferred from the outside. Because the condensation protrusion 325 should repeatedly move upward and downward through an external input (e.g., a keypad, a home key), the condensation protrusion 325 may be preferably both durability and elasticity. In order to relieve an impact of an input, the condensation protrusion 325 may be made of an elastic material.

According to an exemplary embodiment, the condensation protrusion 325 may be formed with a synthetic polymer compound such as silicon, polycarbonate, acryl-based, urethane-based, and UV.

Figure 4:
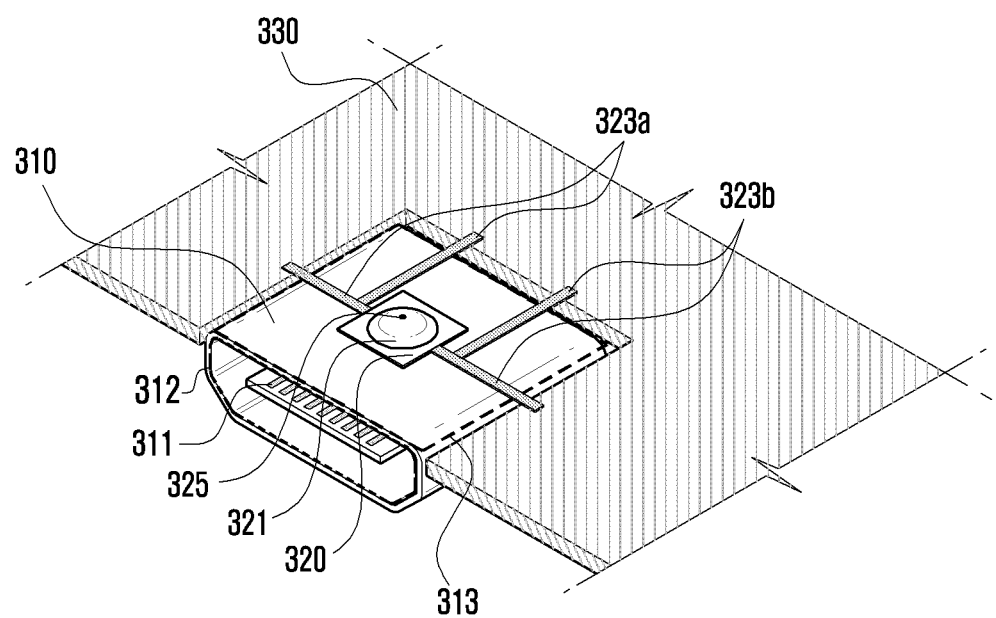
FIG. 4 and FIG. 5 are diagrams illustrating a connection of a substrate and a switch according to an exemplary embodiment of the present disclosure.
Figure 5:
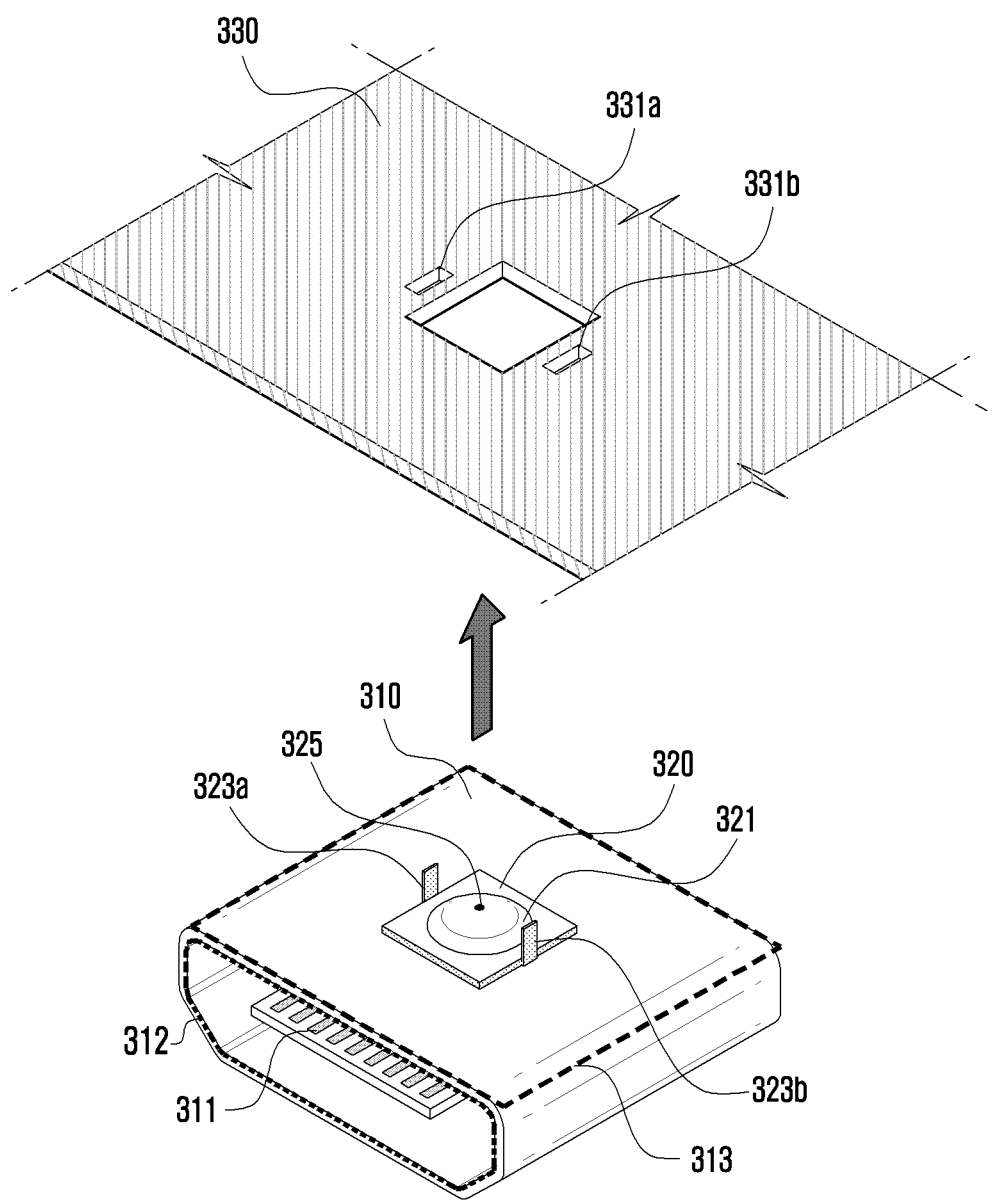

FIGS. 4 and 5 are diagrams illustrating a connection of a substrate 330 and a switch 320 according to various exemplary embodiments of the present disclosure.

According to an exemplary embodiment of the present disclosure, the substrate 330 may include a Printed Circuit Board (PCB). The substrate 330 may be connected to the connection terminals 323a and 323b of the switch 320 and may be mounted at a surface at which the switch 320 is not located. For example, while the substrate 330 is located at an upper end portion of the connector 310, the substrate 330 may be mounted at a surface at which the switch 320 is not located or while the substrate 330 is not located at an upper end portion of the connector 310, the substrate 330 may be mounted at a surface at which the switch 320 is not located.

According to various exemplary embodiments, as shown in FIG. 4, when the substrate 330 and the connection terminals 323a and 323b of the switch 320 are extended and are connected to one another along a plane (e.g., in a linear direction or a constant direction), and the substrate 330 may be located at a side surface of the switch 320. For example, the substrate 330 may define a plane (e.g., an area of the upper end portion 313 of the connector 310 is empty), except for the upper end portion 313 of the connector 310. According to an exemplary embodiment, the substrate 330 may define a flat plane, and some elements of the substrate 330 may be formed in a step shape.

As shown in FIG. 5, the connection terminal 323a (e.g., a hole, a connection point) of the switch 320 may be fastened to the first contact point 331a (e.g., a hole, a connection point) of the substrate 330 bored at a predetermined surface of the substrate 330, and the connection terminal 323b of the switch 320 may be fastened to the second contact point 331b (e.g., a hole, a connection point) of the substrate 330. By fastening the connection terminals 323a and 323b of the switch 320 to the first contact point 331a and the second contact point 331b of the substrate 330, the switch 320 and the substrate 330 may be connected.

According to an exemplary embodiment, in order to fasten the switch 320 and the substrate 330 by fastening a predetermined device, the substrate 330 may define a plane including an empty space corresponding to an area of the switch 320 and an area of the contact points 331a and 331b. According to an exemplary embodiment, the substrate 330 may define a plane in which an area larger than that of the switch 320 is cut (e.g., cutting, etching). For example, as the switch 320 and the substrate 330 are fastened, the substrate 330 may be located at the upper end portion 313 of the connector 310.

Figure 6:
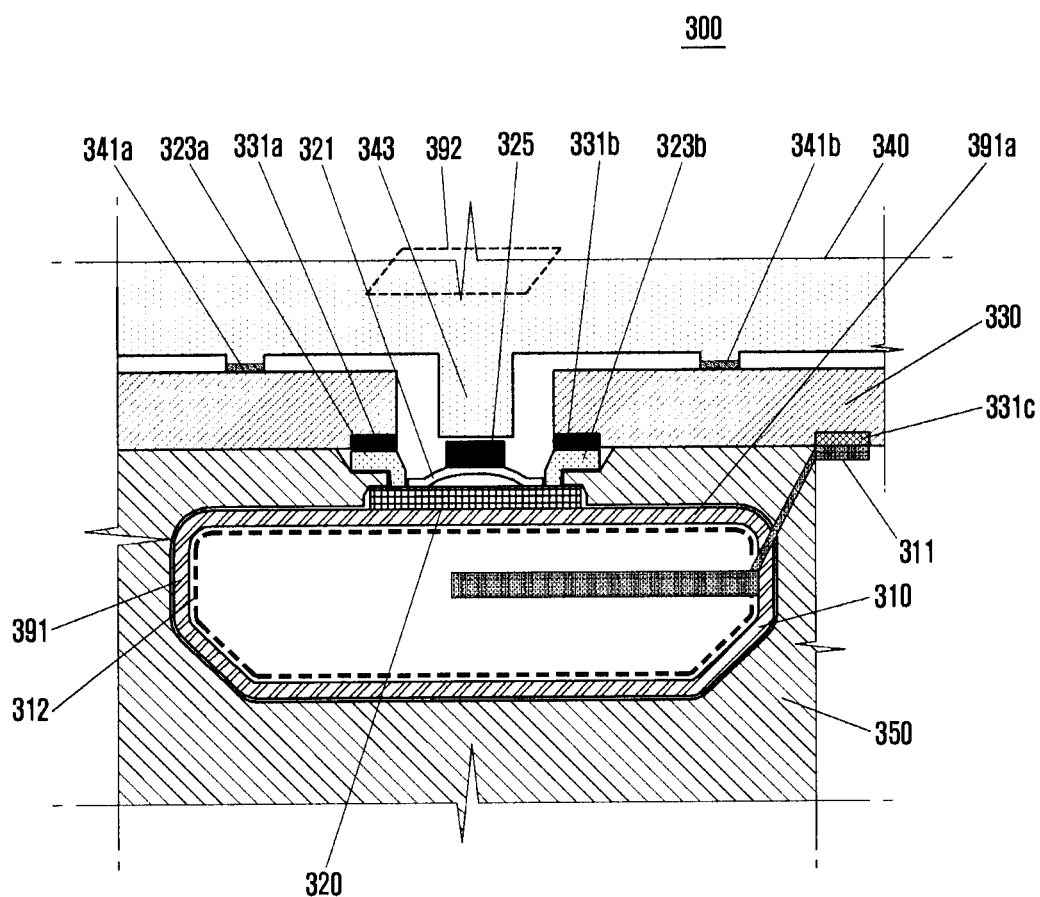
FIG. 6 is a cross-sectional view illustrating an input device according to an exemplary embodiment of the present disclosure.

FIG. 6 is a cross-sectional view illustrating an input device 300 according to various exemplary embodiments of the present disclosure.

According to an exemplary embodiment of the present disclosure, the input device 300 may include a connector 310, switch 320, substrate 330, key base 340, and protection portion 350.

According to an exemplary embodiment, in the upper end portion 313 of the connector 310, the switch 320 may be located. The connector 310 may include a connection terminal 311. When the external device (e.g., an USB interface, an earphone device) is mounted, the connection terminal 311 of the connector 310 may detect a signal and transfer the signal to the contact point 331c of the substrate 330. The substrate 330 may transfer the transferred signal to the AP 210 as a signal notifying that the external interface is mounted.

In an upper portion of the switch 320, the key base 340 may be located. The key base 340 may be separated from the condensation protrusion 325 by a predetermined distance.

According to an exemplary embodiment, the key base 340 includes a home key 392, and is located at an upper portion of the switch 320 to transfer a pressing force of the user to the switch 320. The key base 340 is located in an upper portion of the switch 320 to press the switch 320. Further, the key base 340 may include a pressing protrusion 343 separated by a predetermined distance. The pressing protrusion 343 may be formed in a protrusion form for pressing the switch 320.

According to an exemplary embodiment, while the substrate 330 is located at the upper end portion 313 of the connector 310, the substrate 330 may be mounted at a surface at which the switch 320 is not located. In this case, the pressing protrusion 343 may press the switch 320 protruded to an area bored (e.g., drilled to have a hole) at a predetermined surface of the substrate 330. For example, a predetermined area of the substrate 330 may be bored by cutting or etching. The pressing protrusion 343 may press the switch 320 protruded to a bored area of the substrate 330.

According to an exemplary embodiment, the key base 340 may include movement prevention portions 341a and 341b for preventing a lateral movement at both sides of the pressing protrusion 343. For example, the movement prevention portions 341a and 341b may be attached to the substrate 330. The movement prevention portions 341a and 341b may have elasticity, and in a state in which a pressure is not applied, the movement prevention portions 341a and 341b maintain a shape, and when a pressure is applied, the movement prevention portions 341a and 341b may be restored to an original state. For example, the movement prevention portions 341a and 341b may be made of the same material as that of the key base 340 and may be an elastic material (e.g., rubber, spring, high elastic sponge, and compression sponge, etc.).

According to an exemplary embodiment, the key base 340 may be made of a flexible material (e.g., rubber, silicon, etc.). According to an exemplary embodiment of the present disclosure, the protection portion 350 may be mounted to cover the connector 310, except for a surface at which the switch 320 is located. According to an exemplary embodiment, the protection portion 350 may be mounted to cover only a side surface of the switch 320. The protection portion 350 may block or reduce physical injection of substances (e.g., liquid, gas, and/or impurities) from the outside or a vibration which may be caused by external forces such as, for example, external pressure or an impact. For example, the protection portion 350 may be formed with rubber or Epoxy Molding Compound (EMC) molding. According to an exemplary embodiment, when the protection portion 350 covers planes in which the switch 320 of the connector 310 is not located, the substrate 330 may be located at an upper end portion of the protection portion 350.

According to an exemplary embodiment of the present disclosure, in the electronic devices 100, 101, and 104, the input device 300 that detects a signal input from the outside may include the connector 310 that recognizes a connection of an external device. Further, the input device 300 is located at an upper end portion of the connector 310, and when a physical input of a threshold pressure or more is pressed, the input device 300 may include the switch 320 that connects an electrical signal. Further, the input device 300 may include the substrate 330 connected to the connection terminals 323a and 323b of the switch 320 and mounted at a surface at which the switch 320 is not located. Further, the input device 300 may include the key base 340 located at an upper end portion of the switch 320 and that presses the switch 320.

According to an exemplary embodiment of the present disclosure, the electronic devices 100, 101, and/or 104 may include an input recognition module that has the hole 312 in which an external device can be inserted and may include a surface 391 that covers the hole 312 and the inserted external device and extends in an insertion direction of the external device. The switch 320 may be formed at a side surface 391a of the extended surface and may be formed to have a convex surface. When the external device is inserted, the input recognition module recognizes a connection of the external device, and when a physical input of a threshold pressure or more is pressed to the switch 320, the input recognition module may connect an electrical signal.

According to various exemplary embodiments, at least a portion of a method (e.g., operations) or a device (e.g., modules or functions thereof) according to the present disclosure may be implemented with an instruction stored at computer-readable storage media in a form of, for example, a programming module. When the instruction is executed by at least one processor (e.g., the processor 210), the at least one processor may perform a function corresponding to the instruction. The computer-readable storage media may be, for example, the memory 230. At least a portion of the programming module may be implemented (e.g., executed) by, for example, the processor 210. At least a portion of the programming module may include, for example, a module, a program, a routine, sets of instructions, or a process for performing at least one function.

The computer-readable storage media may include magnetic media such as a hard disk, floppy disk, and magnetic tape, optical media such as a Compact Disc Read Only memory (CD-ROM) and a Digital Versatile Disc (DVD), magneto-optical media such as a floptical disk, and a hardware device, specially formed to store and perform a program instruction (e.g., a programming module), such as a Read Only memory (ROM), a Random Access memory (RAM), and a flash memory. Further, a program instruction may include a high-level language code that may be executed by a computer using an interpreter as well as a machine language code generated by a compiler. In order to perform operation of the present disclosure, the above-described hardware device may be formed to operate as at least one software module, and vice versa.

A module or a programming module according to the present disclosure may include at least one of the foregoing constituent elements, may omit some constituent elements, or may further include additional other constituent elements. Operations performed by a module, a programming module, or another constituent element according to the present disclosure may be executed with a sequential, parallel, repeated, or heuristic method. Further, some operations may be executed in different orders, may be omitted, or may add other operations.

As described above, in an input device according to various exemplary embodiments of the present disclosure, by integrally forming a connector and a switch, the input device can have a small thickness.

An input device according to various exemplary embodiments of the present disclosure can add a structure that performs various functions by reducing a thickness thereof.

Although exemplary embodiments of the present disclosure have been described in detail hereinabove, it should be clearly understood that many variations and modifications of the basic inventive concepts herein described, which may appear to those skilled in the art, will still fall within the spirit and scope of the exemplary embodiments of the present disclosure as defined in the appended claims.

What is claimed is:

1. An input device, comprising:
  a connector that recognizes a connection of an external device, the connector including an upper end portion;
  a switch located at the upper end portion of the connector, the switch being configured toe conduct an electrical signal when a physical input of a threshold pressure or more is pressed, the switch including a connection terminal;

a substrate connected to the connection terminal of the switch and mounted at a surface in which the switch is not located; and a key base that is configured to press the switch, wherein the substrate includes a hole bored at a predetermined location and wherein the connection terminal of the switch is fastened at the hole of the substrate.

2. The input device of claim 1, wherein the switch is mounted to the upper end portion of the connector via a detachable tape.

3. The input device of claim 1, wherein the switch is affixed to a location at the upper end portion of the connector.

4. The input device of claim 1, wherein the switch is fastened to a location at the upper end portion of the connector.

5. The input device of claim 1, wherein the key base further comprises a pressing protrusion that is configured to press the switch.

6. The input device of claim 1, wherein the switch further comprises a condensation protrusion protruded at an upper end portion of the switch.

7. The input device of claim 1, wherein the key base further comprises a movement prevention portion that prevents a movement of the key base relative to the device of a distance of at least a predetermined threshold value.

8. The input device of claim 1, wherein the substrate is mounted at a surface at which the switch is not located.

9. The input device of claim 8, wherein the substrate is mounted to the upper end portion of the connector.

10. The input device of claim 1, further comprising a protection portion that covers the connector except for at least a portion of the upper end portion of the connector at which the switch is located.

11. The input device of claim 8, wherein the protection portion reduces at least one of a physical injection of substances into the device and a vibration input from impacts to an exterior of the device.

12. The input device of claim 8, wherein the substrate is located at an upper end of the protection portion.

* * * * *